United States Patent
Marino et al.

(10) Patent No.: US 10,211,347 B2
(45) Date of Patent: Feb. 19, 2019

(54) TRANSCAP DEVICE ARCHITECTURE WITH REDUCED CONTROL VOLTAGE AND IMPROVED QUALITY FACTOR

(71) Applicant: QUALCOMM Incorporated, San Diego, CA (US)

(72) Inventors: Fabio Alessio Marino, San Marcos, CA (US); Narasimhulu Kanike, San Diego, CA (US); Qingqing Liang, San Diego, CA (US); Francesco Carobolante, San Diego, CA (US); Paolo Menegoli, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/706,352

(22) Filed: Sep. 15, 2017

(65) Prior Publication Data

US 2018/0374963 A1    Dec. 27, 2018

Related U.S. Application Data

(60) Provisional application No. 62/524,171, filed on Jun. 23, 2017.

(51) Int. Cl.
*H01L 27/108* (2006.01)
*H01L 29/93* (2006.01)
*H01L 27/08* (2006.01)
*H01L 29/94* (2006.01)
*H01L 29/66* (2006.01)
(Continued)

(52) U.S. Cl.
CPC .......... *H01L 29/93* (2013.01); *H01L 27/0629* (2013.01); *H01L 27/0805* (2013.01); *H01L 27/1266* (2013.01); *H01L 29/0688* (2013.01); *H01L 29/42316* (2013.01); *H01L 29/66189* (2013.01); *H01L 29/94* (2013.01)

(58) Field of Classification Search
CPC ............. H01L 29/66181; H01L 29/945; H01L 27/10829; H01L 27/0629; H01L 28/40; H01L 27/0805
USPC ........................................................ 257/301
See application file for complete search history.

(56) References Cited

U.S. PATENT DOCUMENTS 6,858,918 B2   2/2005  Maeda et al.
8,026,552 B2   9/2011  Yamashita et al.
(Continued)

OTHER PUBLICATIONS

International Search Report and Written Opinion—PCT/US2018/034829—ISA/EPO—dated Aug. 24, 2018.

*Primary Examiner* — Theresa T Doan
(74) *Attorney, Agent, or Firm* — Patterson & Sheridan, LLP

(57) ABSTRACT

Certain aspects of the present disclosure provide a semiconductor capacitor. The semiconductor capacitor generally includes an insulative layer, and a semiconductor region disposed adjacent to a first side of the insulative layer. The semiconductor capacitor also includes a first non-insulative region disposed adjacent to a second side of the insulative layer. In certain aspects, the semiconductor region may include a second non-insulative region, wherein the semiconductor region includes at least two regions having at least one of different doping concentrations or different doping types, and wherein one or more junctions between the at least two regions are disposed above or below the first non-insulative region.

12 Claims, 13 Drawing Sheets

(51) Int. Cl.
*H01L 27/06* (2006.01)
*H01L 29/06* (2006.01)
*H01L 29/423* (2006.01)
*H01L 27/12* (2006.01)
*H01L 29/76* (2006.01)

(56) References Cited

U.S. PATENT DOCUMENTS

| | | |
|---|---|---|
| 8,134,222 B2 | 3/2012 | Khan et al. |
| 8,498,094 B2 | 7/2013 | Marino et al. |
| 8,803,288 B1 | 8/2014 | Marino et al. |
| 9,646,963 B1 | 5/2017 | Sun et al. |
| 9,882,066 B1 * | 1/2018 | Marino ................ H01L 29/93 |
| 2006/0109607 A1 | 5/2006 | Arnborg |
| 2006/0138512 A1 * | 6/2006 | Sato ................ H01L 27/1087 |
| | | 257/300 |
| 2015/0194538 A1 * | 7/2015 | Marino ................ H01L 29/94 |
| | | 327/530 |
| 2016/0294369 A1 | 10/2016 | Bao et al. |
| 2018/0062001 A1 | 3/2018 | Carobolante et al. |

* cited by examiner

TRANSCAP DEVICE ARCHITECTURE WITH REDUCED CONTROL VOLTAGE AND IMPROVED QUALITY FACTOR

CROSS-REFERENCE TO RELATED APPLICATIONS

This application claims benefit of priority to provisional application No. 62/524,171, filed Jun. 23, 2017, which is expressly incorporated herein by reference in its entirety.

TECHNICAL FIELD

Certain aspects of the present disclosure generally relate to electronic circuits and, more particularly, to a variable semiconductor capacitor.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure provide a semiconductor capacitor. The semiconductor capacitor generally includes an insulative layer and a semiconductor region disposed adjacent to a first side of the insulative layer. The semiconductor capacitor also includes a first non-insulative region disposed adjacent to a second side of the insulative layer. In certain aspects, the semiconductor region includes a second non-insulative region and at least two regions having at least one of different doping concentrations or different doping types, wherein one or more junctions between the at least two regions are disposed above or below the first non-insulative region. In certain aspects, the semiconductor region also includes a third non-insulative region such that a capacitance between the first non-insulative region and the second non-insulative region is configured to be adjusted by varying a control voltage applied to the third non-insulative region with respect to the first non-insulative region or the second non-insulative region.

Certain aspects of the present disclosure provide a semiconductor capacitor. The semiconductor capacitor generally includes an insulative layer, a semiconductor region disposed adjacent to a first side of the insulative layer and comprising an intrinsic region, and a first non-insulative region disposed adjacent to a second side of the insulative layer. In certain aspects, the semiconductor region also includes a second non-insulative region having a first doping type.

Certain aspects of the present disclosure provide a method for fabricating a semiconductor capacitor. The method generally includes forming a semiconductor region; forming an insulative layer, wherein the semiconductor region is formed adjacent to a first side of the insulative layer; forming a first non-insulative region adjacent to a second side of the insulative layer; forming a second non-insulative region in the semiconductor region, wherein the semiconductor region comprises at least two regions having at least one of different doping concentrations or different doping types, and wherein one or more junctions between the at least two regions are formed above or below the first non-insulative region; and forming a third non-insulative region in the semiconductor region such that a capacitance between the first non-insulative region and the second non-insulative region is configured to be adjusted by varying a control voltage applied to the third non-insulative region with respect to the first non-insulative region or the second non-insulative region.

Certain aspects of the present disclosure provide a method for fabricating a semiconductor capacitor. The method generally includes forming a semiconductor region comprising an intrinsic region; forming an insulative layer, wherein the semiconductor region is formed adjacent to a first side of the insulative layer; forming a first non-insulative region adjacent to a second side of the insulative layer; and forming, in the semiconductor region, a second non-insulative region having a first doping type.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure are generally directed to a semiconductor capacitor structure having a semiconductor regions implemented with one or more regions having different doping concentrations and/or different doping types. In certain aspects, junctions between the one or more regions may be formed above or below a plate terminal region of the semiconductor capacitor to improve the quality factor (Q) of the semiconductor capacitor.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
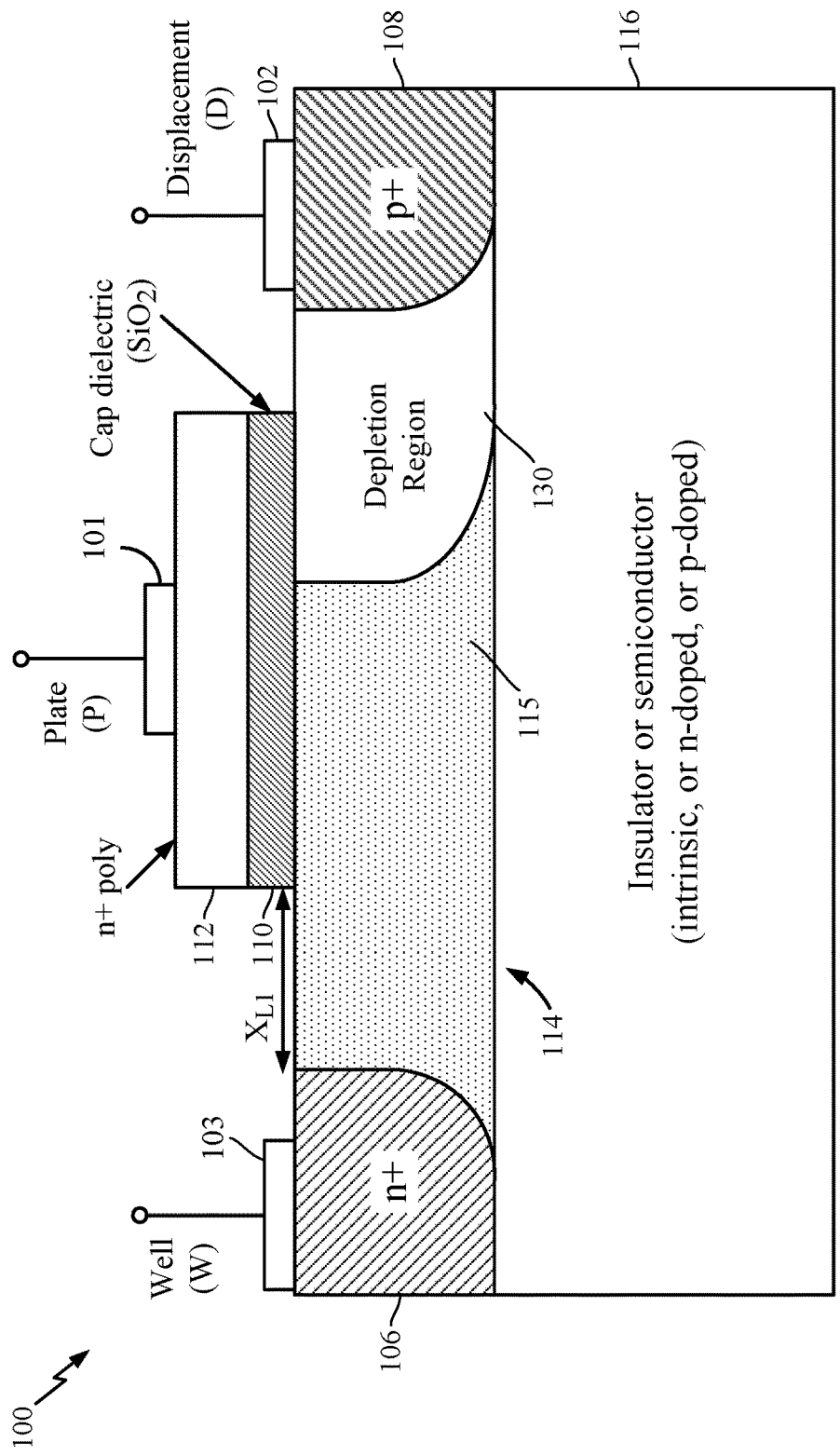
FIG. 1 illustrates an example semiconductor variable capacitor.

FIG. 1 illustrates an example structure of a transcap device 100. The transcap device 100 includes a non-insulative region 112 coupled to a plate (P) terminal 101, a non-insulative region 106 coupled to a well (W) terminal 103, and a non-insulative region 108 coupled to a displacement (D) terminal 102. Certain implementations of a transcap device use a plate oxide layer 110 disposed above a semiconductor region 114. The plate oxide layer 110 may isolate the W and P terminals, and thus, in effect act as a dielectric for the transcap device 100. The non-insulative region 106 (e.g., heavily n doped region) and the non-insulative region 108 (e.g., heavily p doped region) may be formed in the semiconductor region 114 and on two sides of the transcap device 100 in order to create p-n junctions. As used herein, a non-insulative region generally refers to a region that may be conductive or semiconductive.

In certain aspects, a bias voltage may be applied between the D terminal 102 and the W terminal 103 in order to modulate the capacitance between the P and W terminals. For example, by applying a bias voltage to the D terminal 102, a depletion region 130 may be formed between the p-n junction of the non-insulative region 108 and the region 115 of the semiconductor region 114. Based on the bias voltage, this depletion region 130 may widen under the plate oxide layer 110, reducing the area of the equivalent electrode formed by the semiconductor region 114, and with it, the effective capacitance area and capacitance value of the transcap device 100. Furthermore, the bias of the W and P terminals may be set as to avoid the formation of an inverted region underneath the oxide and operate the transcap device 100 in deep depletion mode. By varying the voltage of the W terminal with respect to the P and D terminals, both vertical and horizontal depletion regions may be used to modulate the capacitance between the W and P terminals.

The work-function of the non-insulative region 112 above the plate oxide layer 110 may be chosen to improve the device performance. For example, an n-doped poly-silicon material may be used (instead of p-doped), even if the semiconductor region 114 underneath the plate oxide layer 110 is doped with n-type impurities. In some aspects, a metallic material (also doped if desired) may be used for the non-insulative region 112 with an opportune work-function or a multi-layer stack of different metallic materials to obtain the desired work-function. In certain aspects, the non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the region 116 may be chosen in order to improve the transcap device 100 performance. For example, the region 116 may be an insulator, a semi-insulator, or an intrinsic/near-intrinsic semiconductor in order to decrease the parasitic capacitances associated with the transcap device 100. In some cases, the region 116 may be made of n-doped or p-doped semiconductor with an appropriate doping profile in order to increase the transcap device Q and/or the control on the depletion region 130 that may be formed between the non-insulative region 108 and the region 115 of the semiconductor region 114 when applying a bias voltage to the D terminal 102. The region 116 may also be formed by multiple semiconductor layers or regions doped in different ways (n, p, or intrinsic). Furthermore, the region 116 may include semiconductors, insulating layers, and/or substrates or may be formed above semiconductors, insulating layers, and/or substrates.

To better understand the working principle of the transcap device 100, it may be assumed that the D terminal 102 is biased with a negative voltage with respect to the W terminal 103. The width of the depletion region 130 in the semiconductor region 114 may be controlled by applying a control voltage to the D terminal 102 or to the W terminal 103. The capacitance between the W and P terminals may depend on the width of the depletion region 130 in the semiconductor region 114, and thus, may be controlled by applying the control voltage to the D terminal 102. Furthermore, the variation of the bias voltage applied to the D terminal 102 may not alter the direct-current (DC) voltage between the W and P terminals, allowing for improved control of the device characteristics.

In some cases, it may be preferable to have the non-insulative region 106 and/or non-insulative region 108 a distance away from the plate oxide layer 110 in order to reduce the parasitic capacitance associated with the non-insulative region 108 and improve the isolation of the non-insulative region 106 for high control voltages. For example, the non-insulative region 106 may be partially overlapped with the plate oxide layer 110, or the non-insulative region 106 may be formed at a distance from the edge of the plate oxide layer 110 to increase the device tuning range and linearity. In the latter case, the voltage-withstanding capability of the device is improved since a portion of a radio-frequency (RF) signal, that may be applied to the P and W terminals, drops between the oxide edge and the non-insulative region 106 instead of being applied entirely across the plate oxide layer 110. The non-insulative region 108 may be partially overlapped with the plate oxide layer 110, or the non-insulative region 108 may be spaced apart so as to reduce the parasitic capacitance between the P terminal 101 and the D terminal 102.

In certain aspects, the semiconductor region 114 may be implemented with a p-well region to improve the breakdown voltage of the p-n junction between the non-insulative region 108 and the region 115 of the semiconductor region 114, decreasing, at the same time, the parasitic capacitance between the P terminal 101 and the D terminal 102, as described in more detail herein. Similarly, the semiconductor region 114 may be implemented with an n-doped region between the non-insulative region 106 and region 115 of the semiconductor region 114 in order to regulate the doping concentration between the plate oxide layer 110 and the non-insulative region 106, as described in more detail herein. In certain aspects of the present disclosure, the semiconductor region 114 may be implemented with two or more regions having different doping concentrations and/or different doping types. A junction between the two or more regions may be disposed below the plate oxide layer 110 to improve the Q of the transcap device 100.

Figure 2:
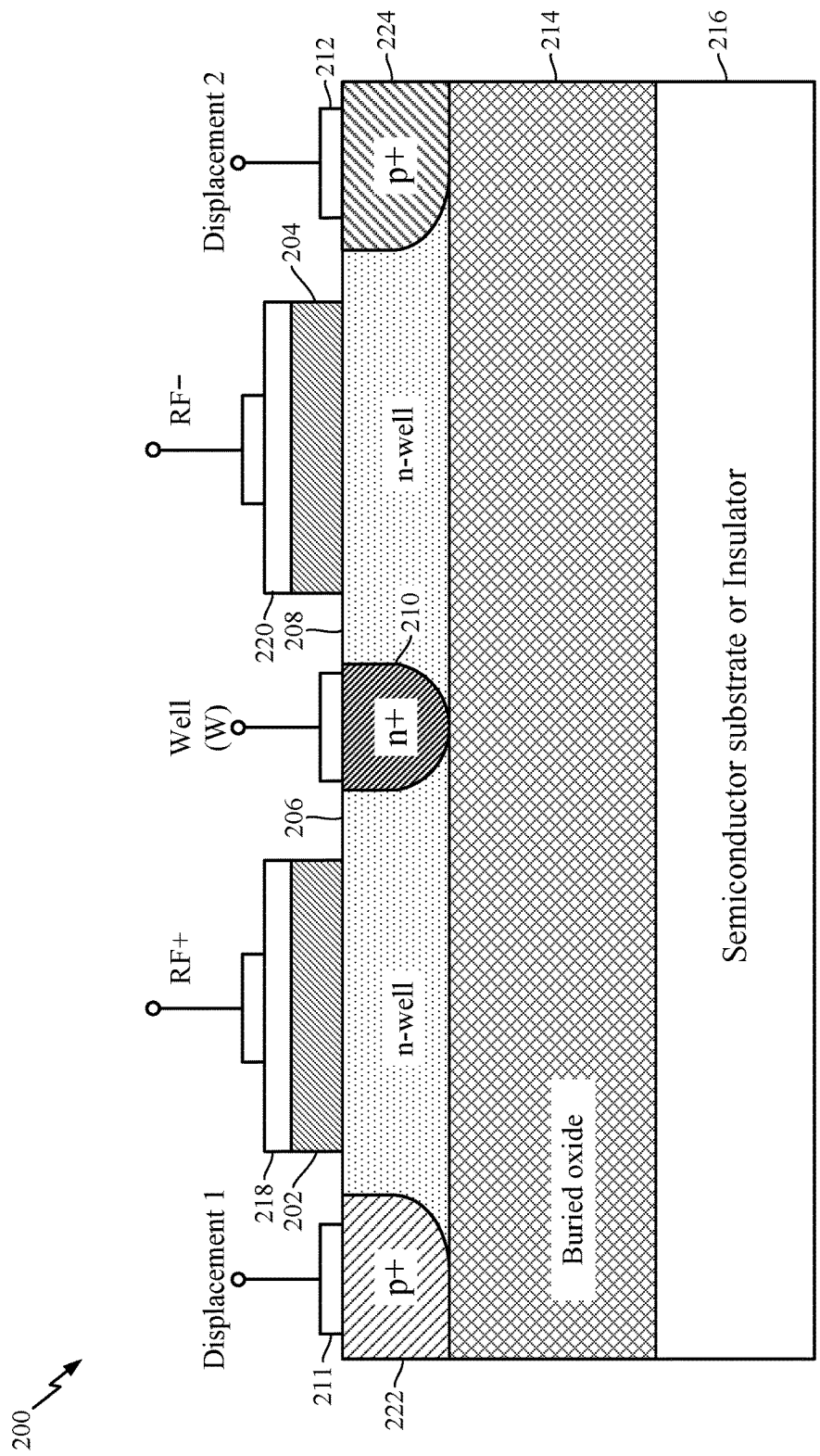
FIG. 2 illustrates an example differential semiconductor variable capacitor.

FIG. 2 illustrates an example differential transcap device 200. The differential transcap device 200 may be obtained by disposing two of the transcap devices 100 back-to-back. In this example, RF+ and RF− terminals (e.g., corresponding to the P terminal in FIG. 1) correspond to the positive and negative nodes of a differential RF port for a differential RF signal. The RF+ terminal may be coupled to a non-insulative region 218, and the RF− terminal may be coupled to a non-insulative region 220, each of the non-insulative regions 218 and 220 disposed above respective oxide layers 202 and 204. N-well regions 206 and 208 may be coupled to a W terminal via a non-insulative region 210 (e.g., n+), as illustrated. The differential transcap device 200 also includes D terminals 211 and 212 coupled to respective non-insulative regions 222 and 224. A bias voltage may be applied to the D terminals 211 and 212 (or to the W terminal with respect to the other terminals of the device) to adjust a depletion region of the n-well regions 206 and 208, respectively, thereby adjusting the capacitance between respective RF+ and RF− terminals and the W terminal. In some aspects, a buried oxide layer 214 may be positioned below the n-well regions 206 and 208 and above a semiconductor substrate or insulator 216, as illustrated.

The capacitance density achievable with the transcap technology may be increased at the expense of device performance. For example, with reference to FIG. 2, the capacitance density may be increased by reducing the distance between the non-insulative regions 218 and 220 for the RF+ and RF− terminals. However, reducing the distance between the non-insulative regions 218 and 220 may increase the parasitic capacitance associated with the structure, lowering the tuning range of the transcap device 200.

The capacitor-voltage (C-V) characteristic of the transcap device 100 determines its performance parameters, such as tuning range (Cmax/Cmin), max control voltage for achieving the full tuning range, Q, and linearity of the transcap device. However, these figures of merit may depend on several process parameters, such as well doping, oxide thickness, n+/p+ proximity to the Plate terminal, and Plate length. A tradeoff may exist between these performance parameters. For example, one may increase the tuning range of a transcap device either by increasing the plate length or by placing the n+ region far away from the plate terminal. However, in both cases, the device Q is degraded, and the tuning voltage used to improve tunability of the transcap device is increased. Similarly, the oxide thickness may be increased to improve the Q, but this choice may lead to a degradation of the tuning range. Likewise, higher well doping may provide better linearity and Q, but it may also degrade the device tuning range. Certain aspects of the present disclosure soften these tradeoffs. Moreover, certain aspects of the present disclosure allow for a sharper transition between capacitance levels of the transcap device, which may be beneficial for transcap usage in digital tuning.

Figure 3:
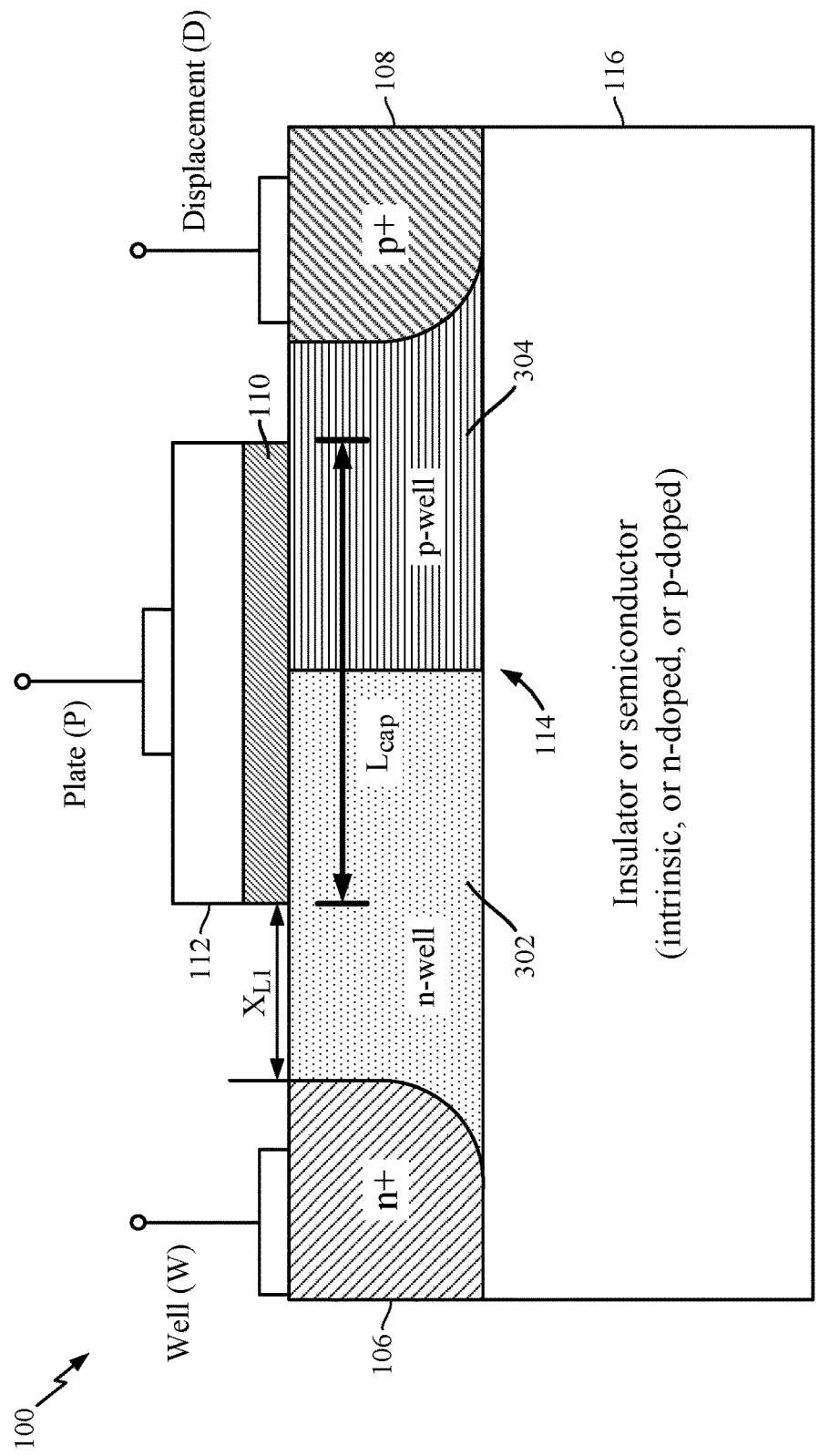
FIG. 3 illustrates a transcap device having a p-n junction formed underneath a plate oxide layer, in accordance with certain aspects of the present disclosure.

FIG. 3 illustrates the transcap device 100 having a p-n junction formed underneath the plate oxide layer 110, in accordance with certain aspects of the present disclosure. For example, the region between the non-insulative regions 106 and 108 may be implemented with an n-well region 302 and a p-well region 304, having a p-n junction underneath the plate oxide layer 110, modifying the electrical field distribution inside the transcap device 100 during operation with respect to the transcap device 100 of FIG. 1. For example, the behavior of the capacitance and Q as a function of the control voltage depends on how the depletion region created by a horizontal electric field, from the non-insulative region 108, moves with respect to the depletion region created by a vertical electric field from the non-insulative region 112. As the p-n junction between the n-well and p-well regions 302 and 304 is formed closer to the n+ region, the depletion region caused by the horizontal electric field may show its effect at a lower control voltage in the C-V characteristic, allowing for the manipulation of the Q of the transcap device 100. This configuration can be useful, especially in modern silicon-on-insulator (SOI) technologies that may use a thin active silicon layer, where the device-Q-versus-control-voltage plot shows a dip due to the unbalanced electric field. In some cases, the structure of transcap device 100 may be implemented by using separate n-well and p-well implantation masks during fabrication.

In certain aspects, the doping concentration of the p-well region 304 may be used to manipulate the electric field distribution inside the transcap device 100. For example, the p-well region 304 may be low-doped or may be replaced with an intrinsic (i) region so as to obtain a p-i-n junction between the non-insulative regions 106 and 108 and further sharpen the transition between high and low capacitance of the transcap device 100. In this case, the length of the intrinsic region may be set to obtain the desired control voltage and C-V characteristic of the transcap device.

Figure 4:
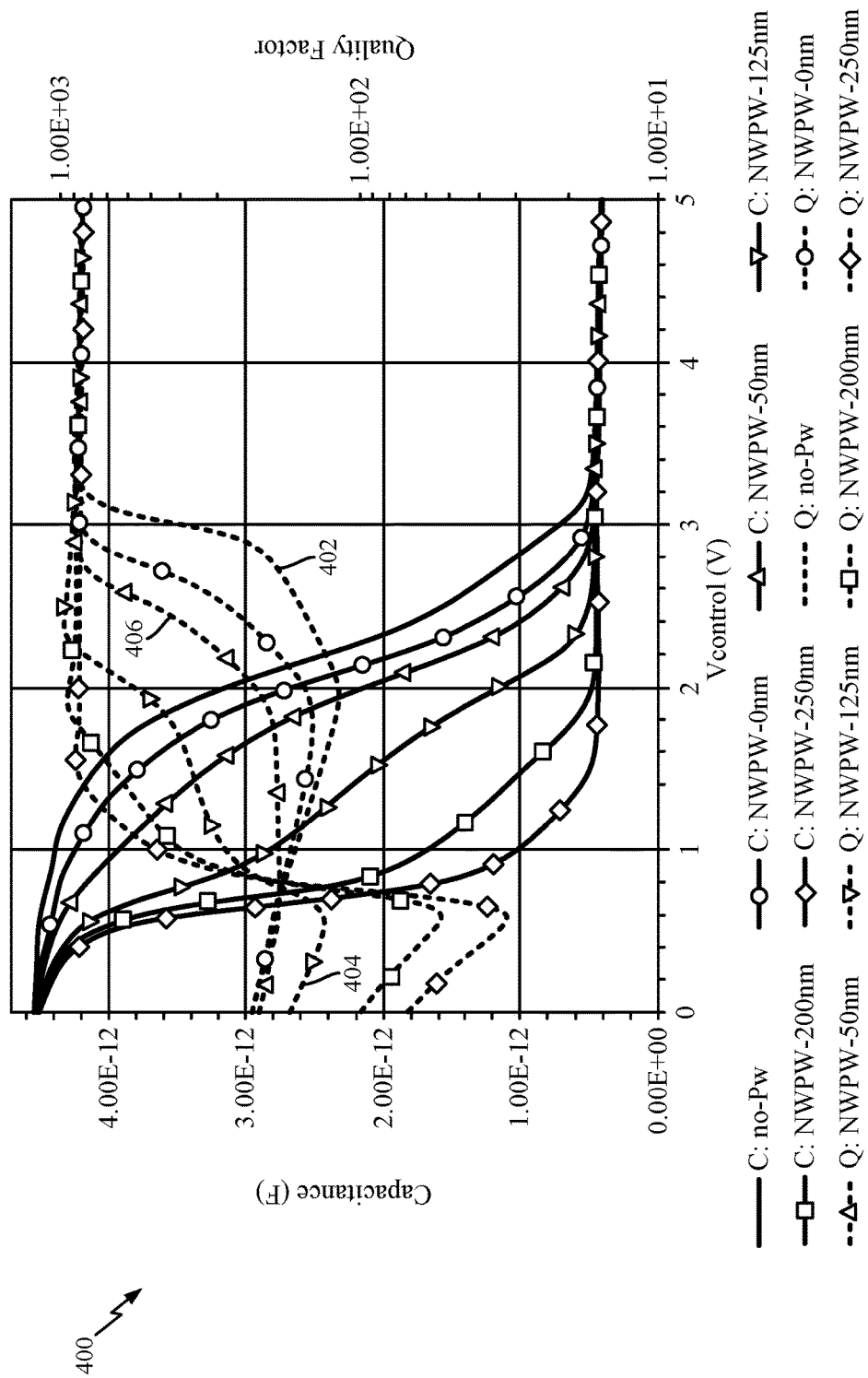
FIG. 4 is a graph illustrating the capacitance and quality factor (Q) of a transcap device as a function of the control voltage for different p-well region lengths, in accordance with certain aspects of the present disclosure.

FIG. 4 is a graph 400 illustrating the capacitance and Q of a transcap device as a function of the control voltage for different p-well region lengths, in accordance with certain aspects of the present disclosure. As illustrated, the structure of the transcap device 100 may be adjusted to improve the device Q from around 120 up to almost 190 with little to no degradation of the tuning range. Alternatively, the control voltage may be reduced up to 2 volts to obtain a sharp transition in the C-V characteristic, which may be especially beneficial in digital applications.

Figure 5A:
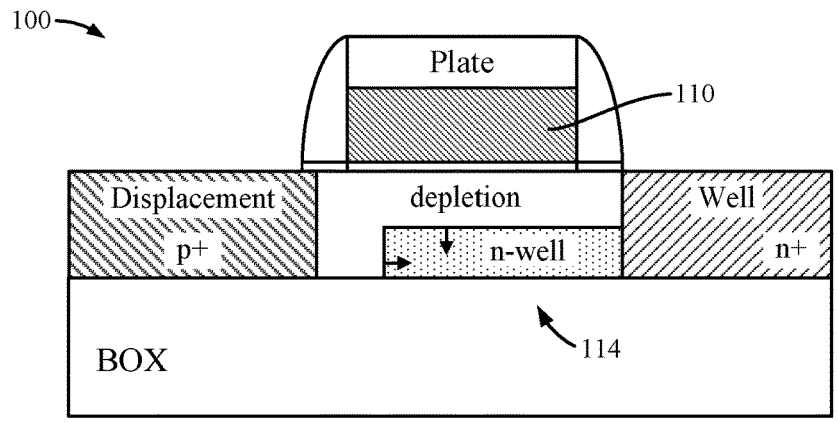
FIGS. 5A-5C illustrate a transcap device implemented with different semiconductor region structures, in accordance with certain aspects of the present disclosure.
Figure 5B:
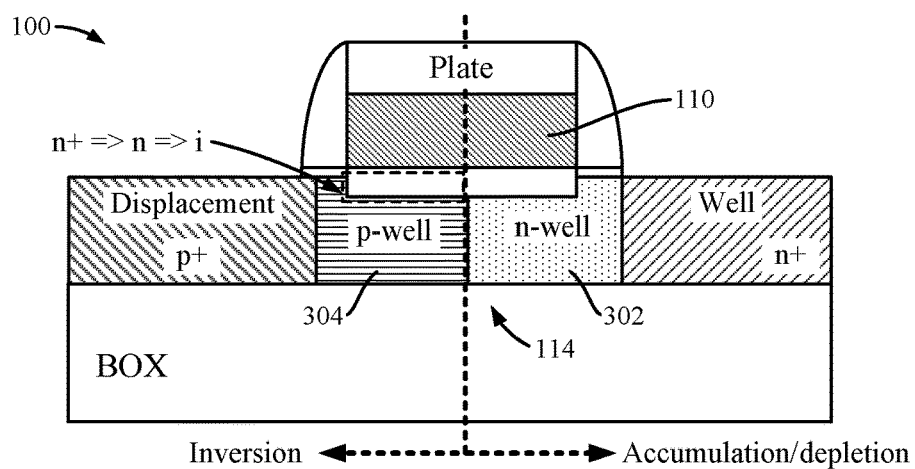
Figure 5C:
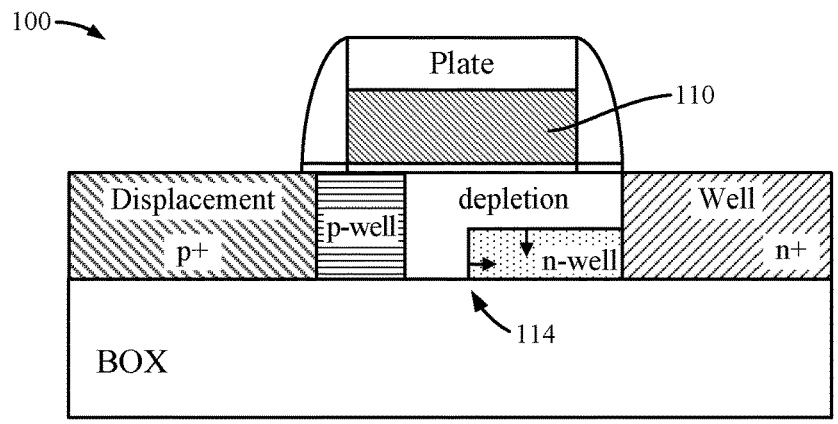

FIGS. 5A-5C illustrate the transcap device 100 implemented with different structures for the semiconductor region 114, in accordance with certain aspects of the present disclosure. The Q curve 402 of graph 400 corresponds to the configuration of the transcap device 100 in FIG. 5A implemented without a p-well region. The Q curve 404 of graph 400 corresponds to the configuration of the transcap device 100 in FIG. 5B implemented with a 125 nm p-well region length. The Q curve 406 of graph 400 corresponds to the configuration of the transcap device 100 in FIG. 5C implemented with a 50 nm p-well region length. As illustrated in FIG. 5B, when a positive bias voltage is applied at the P terminal, the p-well region 304 may be inverted at its interface with the plate oxide layer 110, and electrons are accumulated in the n-well region 302. This causes the maximum capacitance of the transcap device 100 of FIG. 5B to be the same as that of a transcap device realized without a p-well region.

Figure 6A:
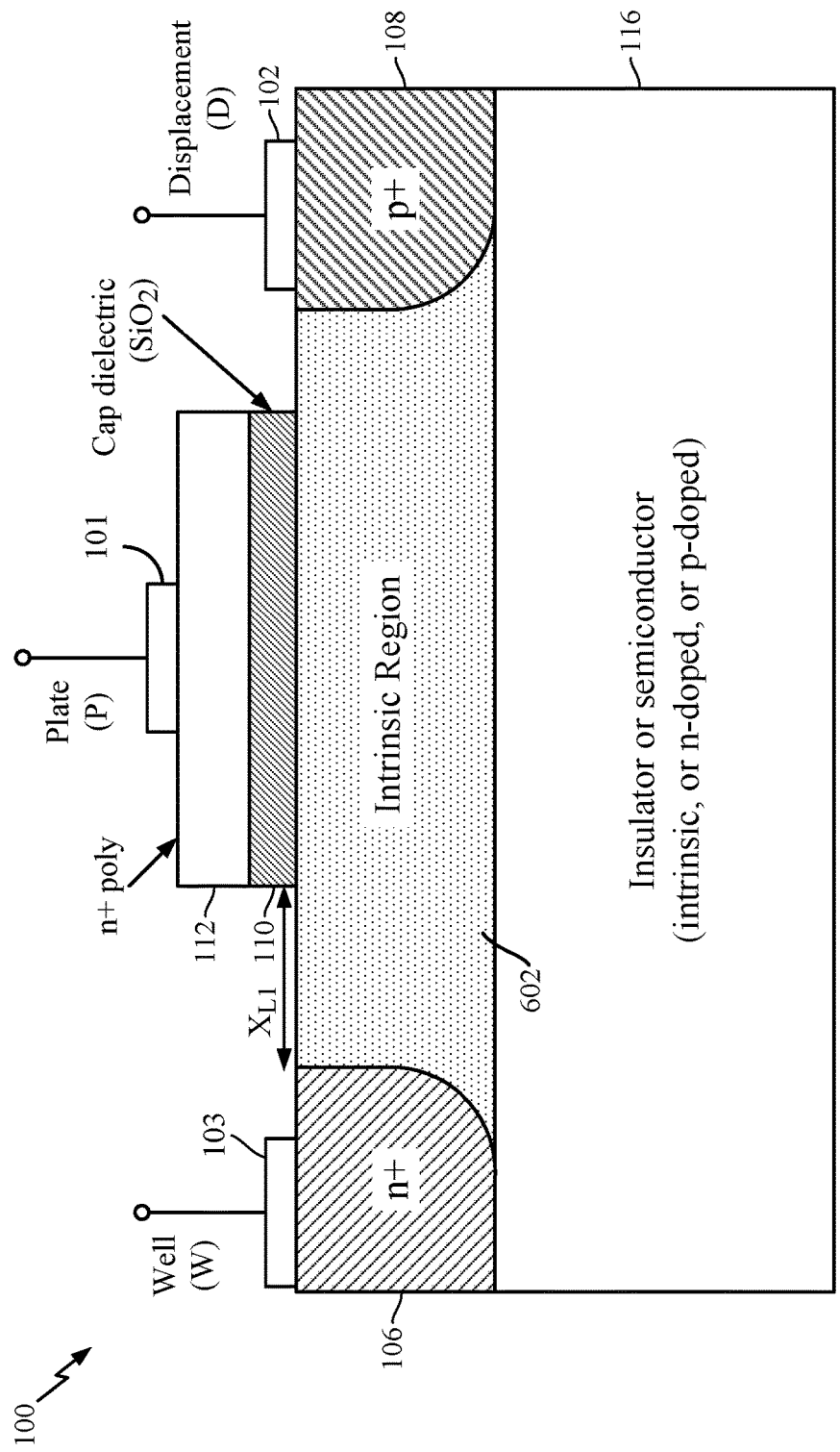
FIG. 6A illustrates a transcap device implemented with an intrinsic region, in accordance with certain aspects of the present disclosure.

FIG. 6A illustrates the transcap device 100 implemented with an intrinsic region 602, in accordance with certain aspects of the present disclosure. In this case, the intrinsic region 602 spans the entire region between the non-insulative region 106 and the non-insulative region 108. As used herein, the term "intrinsic" refers to an intrinsic semiconductor or a near-intrinsic semiconductor (e.g., lightly-doped semiconductor).

Figure 6B:
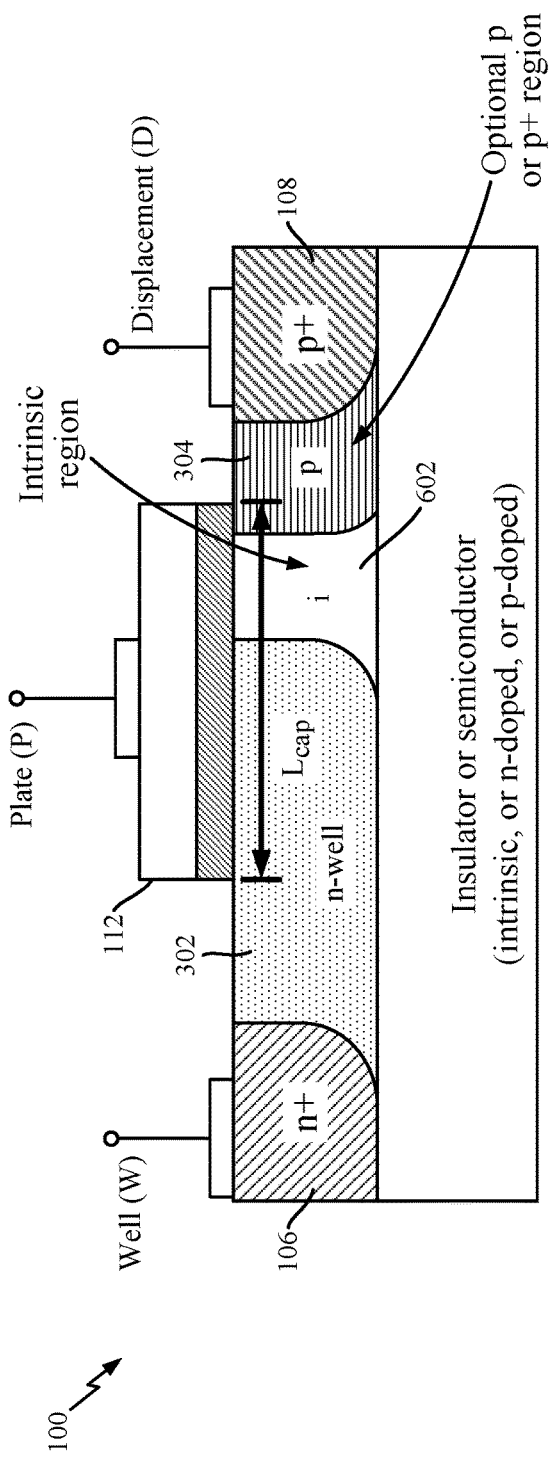
FIGS. 6B and 6C illustrate a cross-section and a top-down view, respectively, of a transcap device implemented with an intrinsic region and an n-well region, in accordance with certain aspects of the present disclosure.
Figure 6C:
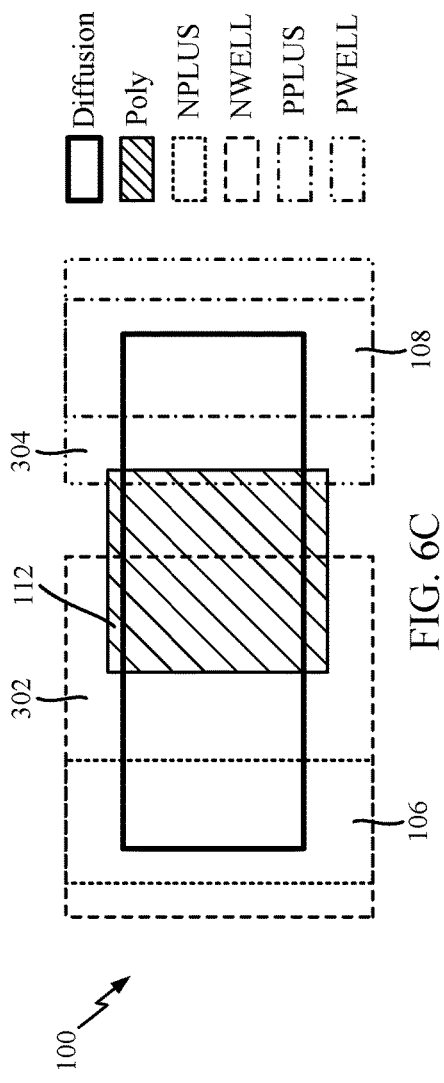

FIGS. 6B and 6C illustrate a cross-section and a top-down view, respectively, of the transcap device 100 implemented with an intrinsic region 602, an n-well region 302, and a p-well region 304, in accordance with certain aspects of the present disclosure. As illustrated, the semiconductor region of the transcap device 100 of FIG. 6B is implemented with the intrinsic region 602, disposed between the n-well and p-well regions 302 and 304. In some cases, the intrinsic region 602 may be a lightly doped p-type (or n-type) region having a dopant concentration on the order of 1e12 $cm^3$.

When a positive bias voltage is applied at the P terminal, the intrinsic region 602 is inverted at its interface with the plate oxide layer (assuming that this region is a lightly doped p-type region), and electrons are accumulated in the n-well region 302. This causes the maximum capacitance of the transcap device to be the same as that of a transcap device realized without an intrinsic region. However, when the P or W terminals are biased such that the transcap device is operated in depletion, the intrinsic region may be depleted faster, causing a steeper reduction in the capacitance with respect to the control voltage when compared to a transcap device implemented without an intrinsic region.

Figure 7:
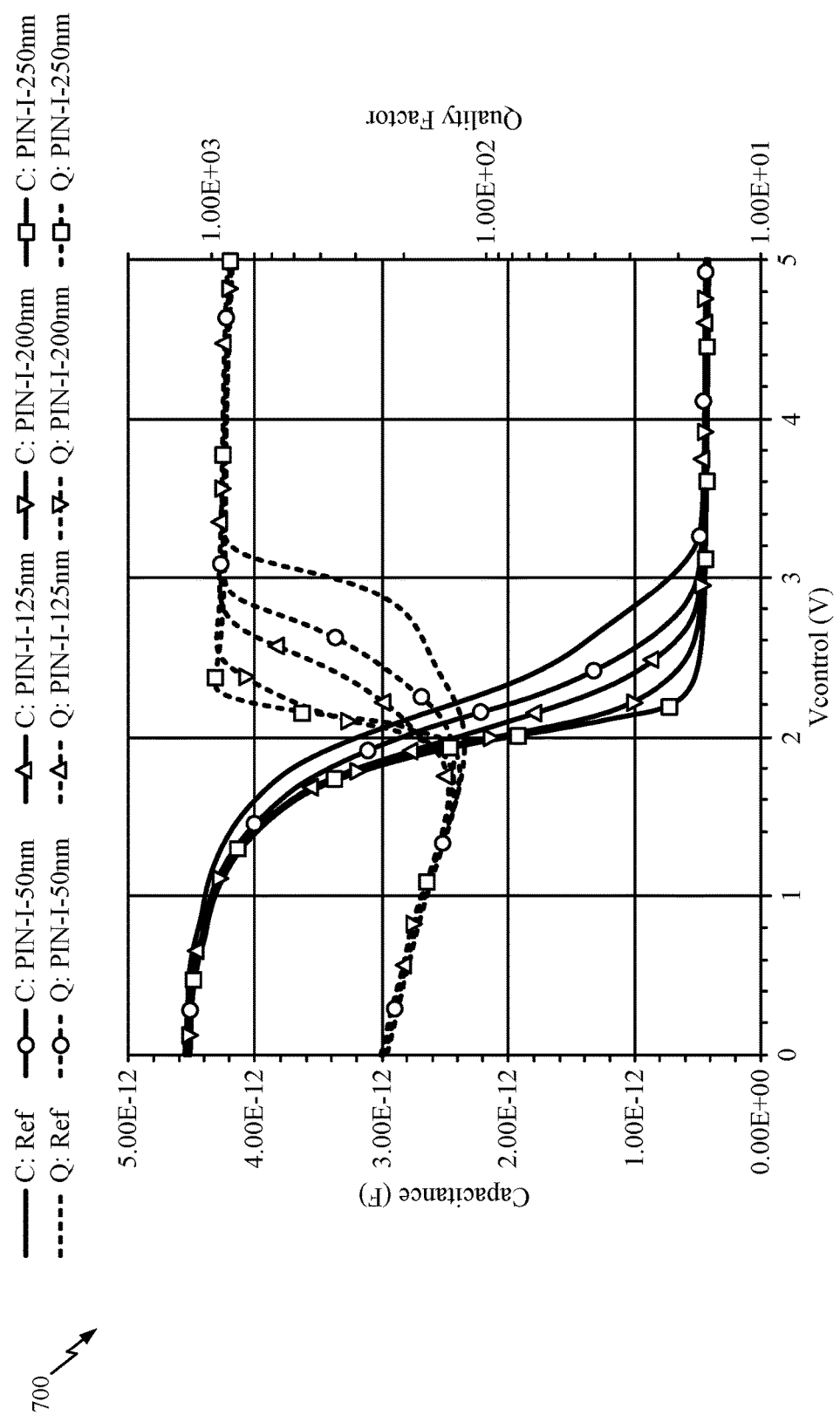
FIG. 7 is a graph illustrating the capacitance and Q of a transcap device as a function of control voltage, with different intrinsic region lengths, in accordance with certain aspects of the present disclosure.

FIG. 7 is a graph 700 illustrating the capacitance and Q of the transcap device 100 of FIGS. 6B and 6C as a function of the control voltage, with different intrinsic region lengths, in accordance with certain aspects of the present disclosure. The graph 700 shows that the transcap device 100 of FIGS. 6B and 6C may be configured to reduce the control voltage up to 1 V and improve Q by up to 20% without degrading the tuning range. The observed improvement in the device Q may be due to the effect of the lateral depletion region caused by the p-n junction, which dominates over the vertical depletion region caused by the plate when the control bias in increased, reducing the maximum effective resistance between the P and W terminals. In certain aspects, an intrinsic region may be added to a two-terminal metal-oxide semiconductor (MOS) varactor to improve the device performance, as described in more detail with respect to FIGS. 8A and 8B.

Figure 8A:
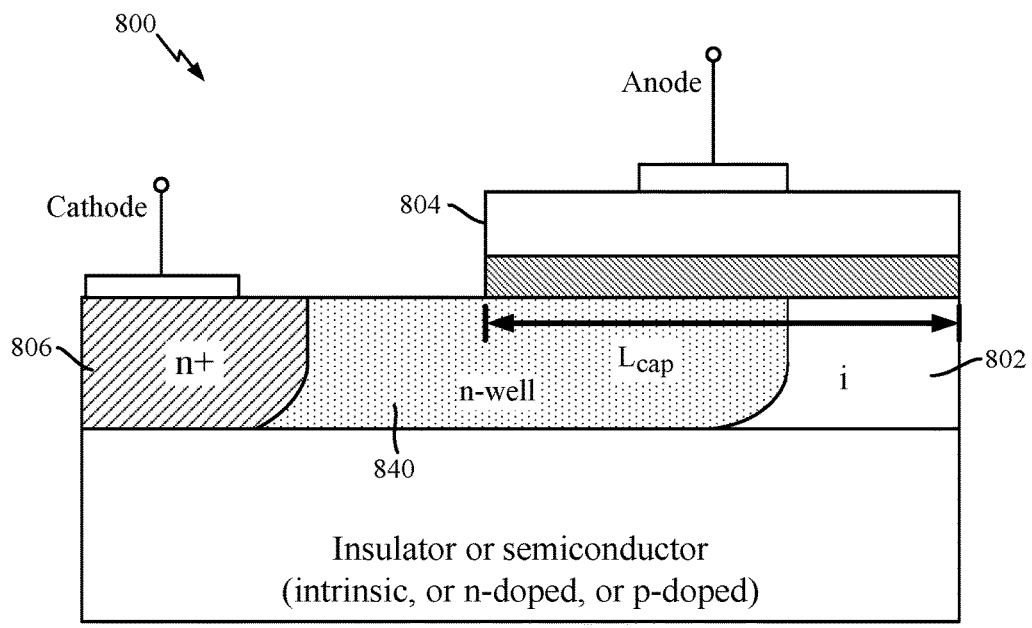
FIGS. 8A and 8B illustrate semiconductor capacitors implemented with an intrinsic region underneath a non-insulative region for an anode, in accordance with certain aspects of the present disclosure.
Figure 8B:
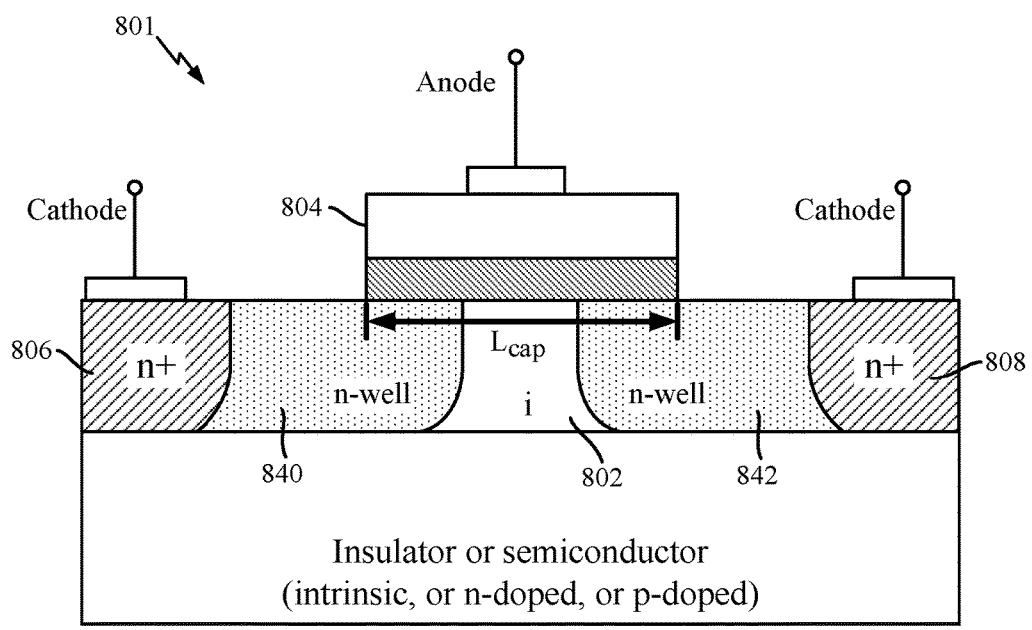

FIGS. 8A and 8B illustrate capacitors 800 and 801, respectively, implemented with an intrinsic region 802 underneath the non-insulative region 804 for the anode, in accordance with certain aspects of the present disclosure. In certain aspects, the capacitor may include a single cathode, as illustrated by capacitor 800 of FIG. 8A, or two cathodes, as illustrated by capacitor 801 of FIG. 8B. The intrinsic region 802 may be disposed between the non-insulative regions 806 and 808 coupled to the cathodes. In certain aspects, the cathodes of capacitor 801 may be shorted, providing a two-terminal capacitor. In certain aspects, the capacitors 800 and 801 may optionally include n-well regions 840 and/or 842. In some cases, the n-well regions 840 and/or 842 may be replaced with heavily doped regions.

Figure 9:
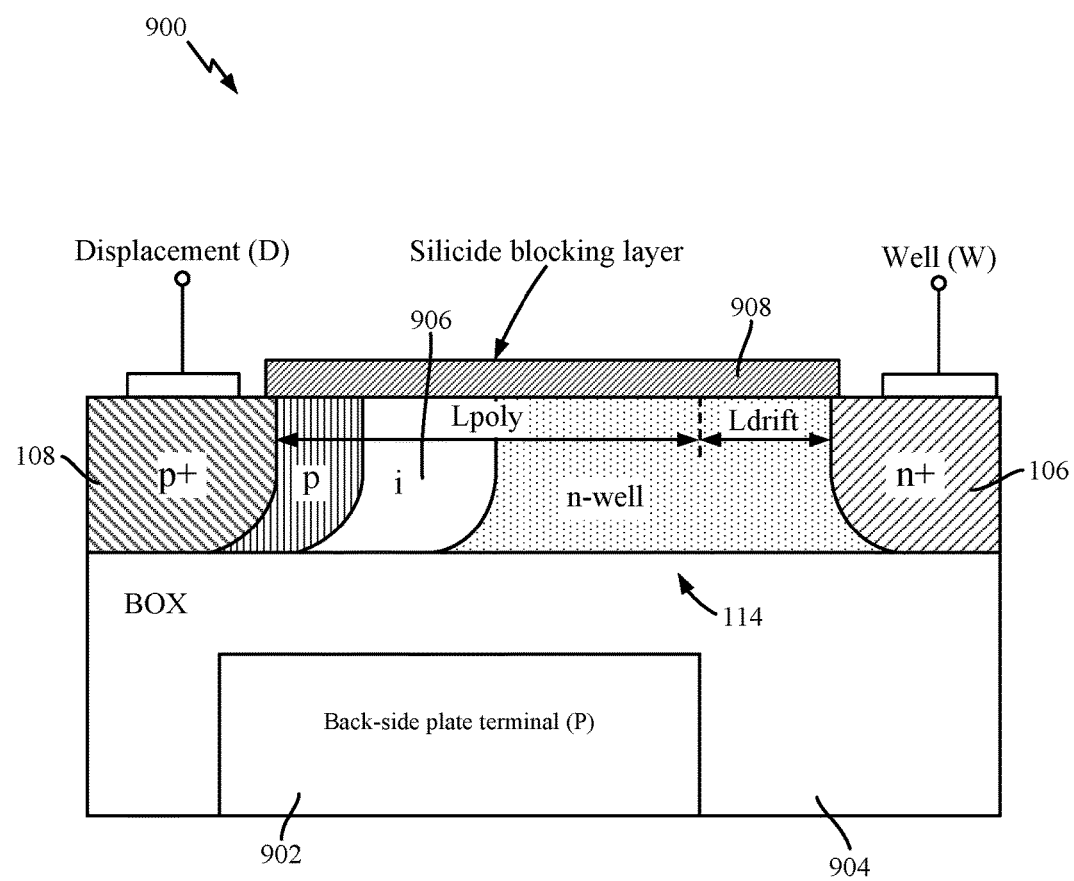
FIG. 9 illustrates a transcap device implemented with a backside plate, in accordance with certain aspects of the present disclosure.

In certain aspects of the present disclosure, the example transcap devices and capacitors described herein may be implemented using a back-gate configuration, as described in more detail with respect to FIG. 9.

FIG. 9 illustrates an example transcap device 900 implemented using a back-gate configuration, in accordance with certain aspects of the present disclosure. For example, a non-insulative region 902 (e.g., a back-side plate terminal) may be formed below at least a portion of a buried oxide (BOX) region 904 of the transcap device 900. Therefore, the BOX region 904 may be used as the plate oxide, and a backside cavity contact may be used as a plate terminal, enabling the use of the transcap device 900 in high voltage applications, for example.

While reducing the maximum control voltage is not a primary objective for this transcap device configuration, the tuning-range-versus-Q performance of the transcap device 900 may be improved by incorporating an intrinsic region 906. The configuration of the transcap device 900 allows for the fabrication of thick oxide transcaps with oxide thicknesses in the range of 30-40 nm with operating voltages up to 15-20 V, for example. In certain aspects, a silicide-blocking layer 908 may be formed above at least a portion of the semiconductor region 114 to prevent the junctions between the different regions of the semiconductor region 114 from being shorted.

Figure 10A:
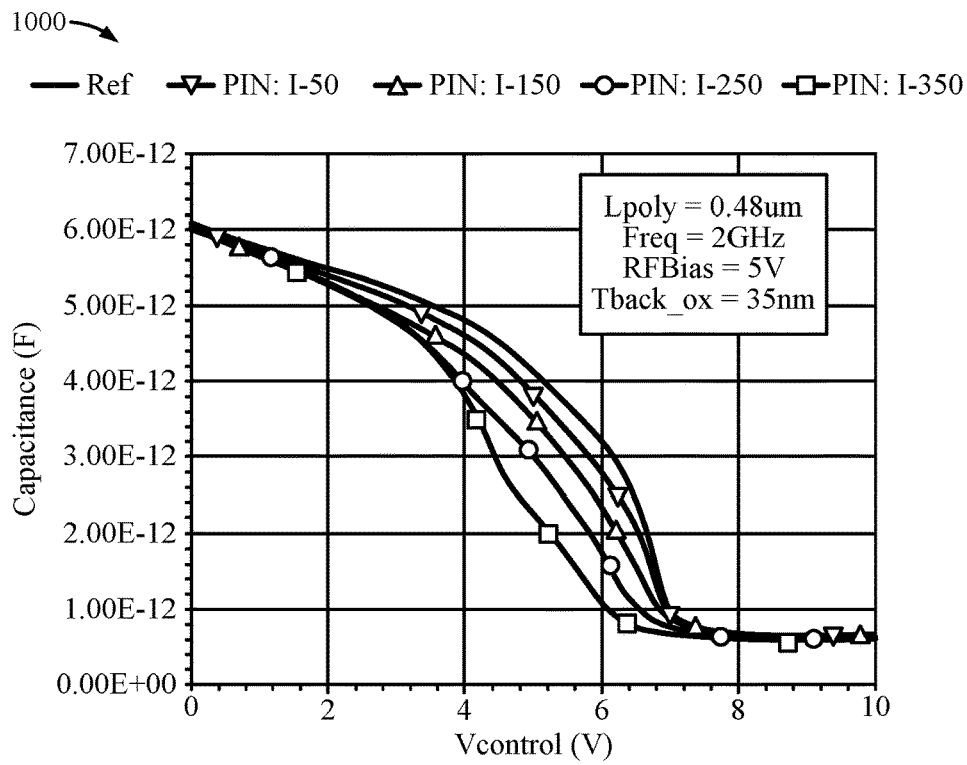
FIGS. 10A and 10B are graphs showing the capacitor-voltage (C-V) characteristics and the Q, respectively, of the transcap device of FIG. 9 for different intrinsic region lengths, in accordance with certain aspects of the present disclosure.
Figure 10B:
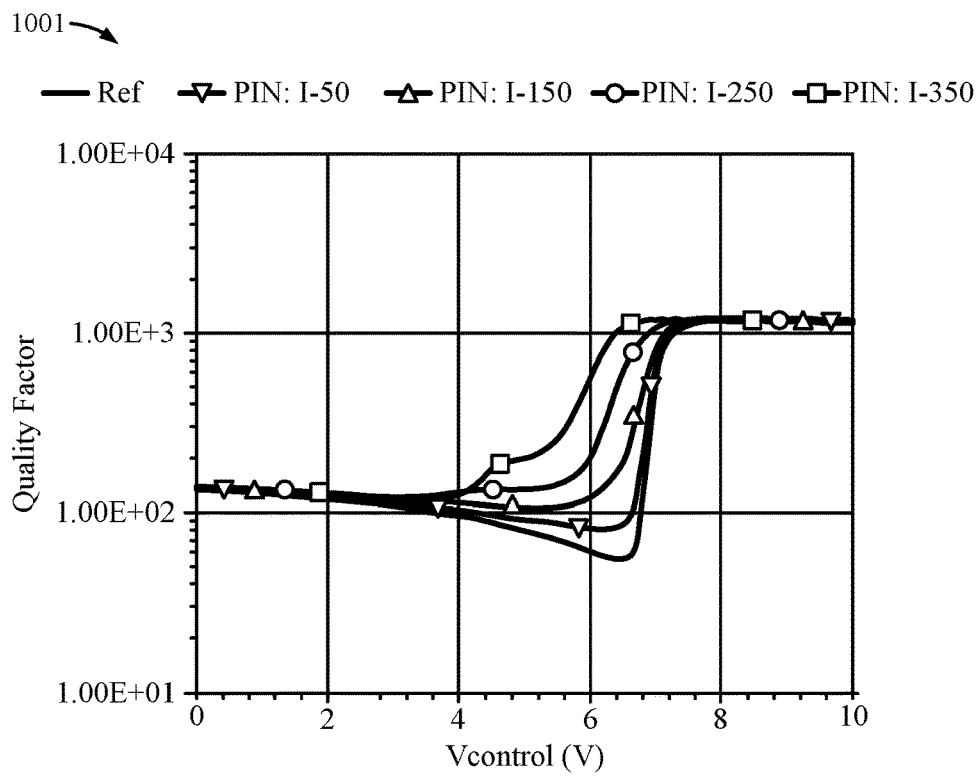

FIGS. 10A and 10B illustrate graphs 1000 and 1001 showing the C-V characteristics and the Q, respectively, of the transcap device 900 for different intrinsic region lengths, in accordance with certain aspects of the present disclosure. As illustrated in graph 1001, the Q of the transcap device 900 is improved as compared to a reference (ref) transcap device incorporated without an intrinsic region. Moreover, there is little to no impact to the tuning range of the transcap device 900 by incorporating the intrinsic region 906, as illustrated in graph 1000. For example, the transcap device 900 (e.g., implemented with a 35 nm oxide, a poly length (Lpoly) of 0.48 μm and a 0.25 μm intrinsic region length) provides a Q of about 122 as compared to a Q of 55 for the reference device for a tuning range of 10×. As illustrated in FIG. 9, Lpoly is the length of the semiconductor region 114 from an edge of the non-insulative region 108 to an edge of the non-insulative region 902.

Figure 11:
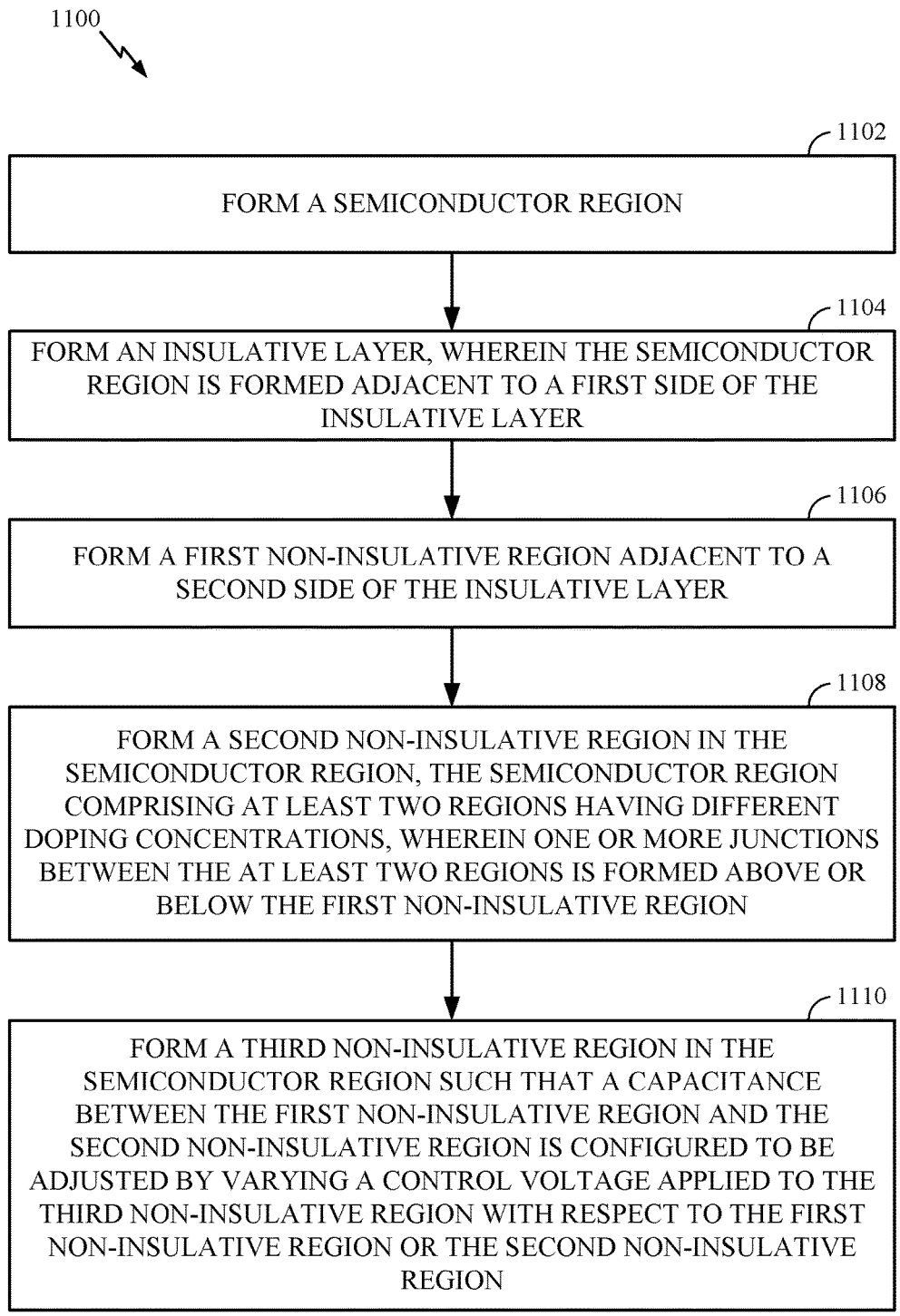
FIGS. 11 and 12 are flow diagrams of example operations for fabricating a semiconductor capacitor, in accordance with certain aspects of the present disclosure.

FIG. 11 is a flow diagram of example operations 1100 for fabricating a semiconductor capacitor, in accordance with certain aspects of the present disclosure. The operations 1100 may be performed, for example, by a semiconductor-processing chamber.

Operations 1100 may begin at block 1102 by forming a semiconductor region (e.g., semiconductor region 114), and at block 1104, forming an insulative layer (e.g., plate oxide layer 110), wherein the semiconductor region is formed adjacent to a first side of the insulative layer. At block 1106, a first non-insulative region (e.g., non-insulative region 112) is formed adjacent to a second side of the insulative layer, and at block 1108, a second non-insulative region (e.g., non-insulative region 106) is formed in the semiconductor region. In certain aspects, the semiconductor region includes at least two regions having at least one of different doping concentrations or different doping types, and one or more junctions between the at least two regions are formed above or below the first non-insulative region.

In certain aspects, the operations 1100 also include, at block 1110, forming a third non-insulative region (e.g., non-insulative region 108) in the semiconductor region such that a capacitance between the first non-insulative region and the second non-insulative region is configured to be adjusted by varying a control voltage applied to the third non-insulative region with respect to the first or second non-insulative region. In certain aspects, the at least two regions may include an n-well region (e.g., n-well region 302) and a p-well region (e.g., p-well region 304), wherein the third non-insulative region is formed adjacent to the p-well region and wherein the second non-insulative region is formed adjacent to the n-well region.

In certain aspects, the at least two regions comprise at least three regions including a first n-well region, a second n-well region, and an intrinsic region formed between the first n-well region and the second n-well region. In other aspects, the at least three regions may include a first p-well region, a second p-well region, and an intrinsic region formed between the first p-well region and the second p-well region.

In certain aspects, the at least two regions may include an n-well region and a p-well region. In this case, a p-n junction between the n-well region and the p-well region is formed above or below the first non-insulative region. In some cases, the at least two regions further comprise an intrinsic region (e.g., intrinsic region 602). The intrinsic region may be formed between the n-well region and the p-well region. In some cases, the n-well region is formed between the p-well region and the intrinsic region.

Figure 12:
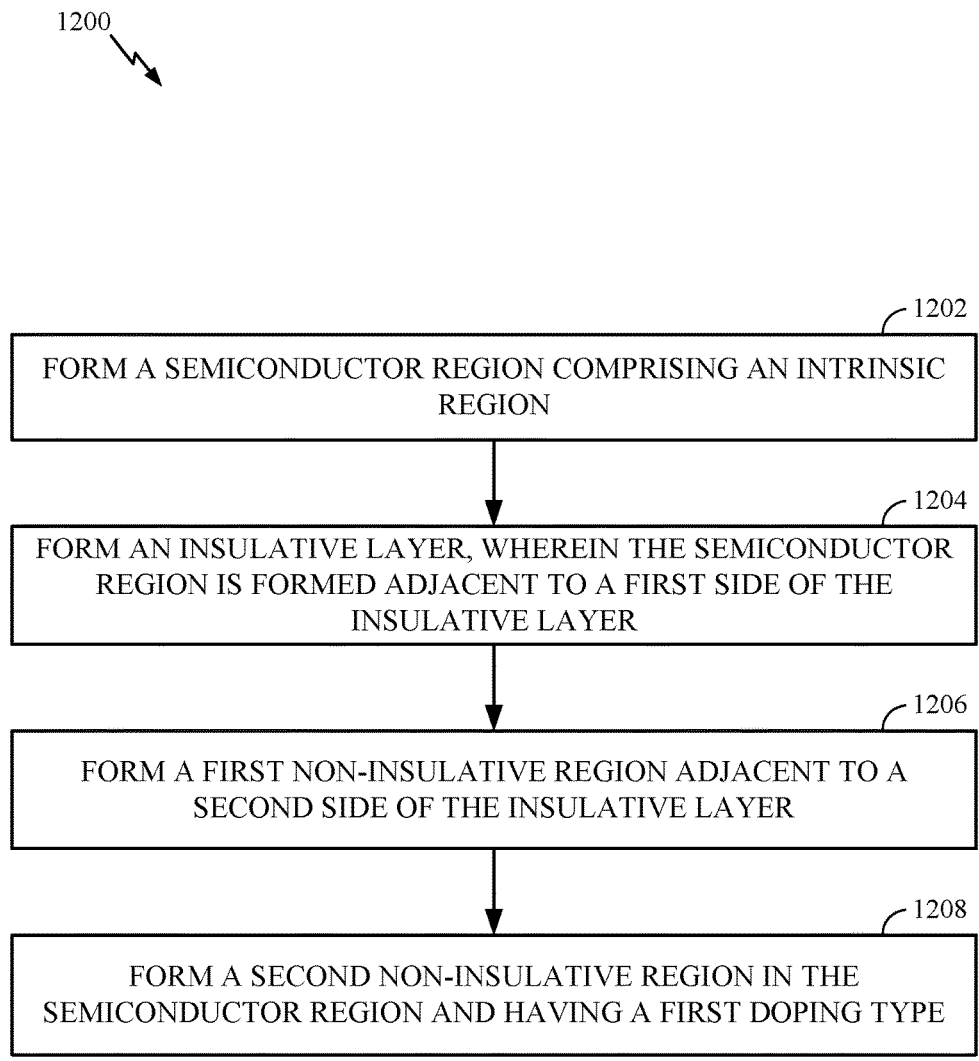

FIG. 12 is a flow diagram of example operations 1200 for fabricating a semiconductor capacitor, in accordance with certain aspects of the present disclosure. The operations 1200 may be performed, for example, by a semiconductor-processing chamber.

Operations 1200 may begin at block 1202 by forming a semiconductor region comprising an intrinsic region, and at block 1204, forming an insulative layer (e.g., plate oxide layer 110), wherein the semiconductor region is formed adjacent to a first side of the insulative layer. At block 1206, a first non-insulative region (e.g., non-insulative region 112) may be formed adjacent to a second side of the insulative layer. At block 1208, a second non-insulative region having a first doping type (e.g., acceptor doping type) may be formed in the semiconductor region. In certain aspects, a third non-insulative region having a second doping type (e.g., donor doping type) may be formed in the semiconductor region. In this case, the intrinsic region is formed between the second non-insulative region and the third non-insulative region.

While several examples have been described herein with specific doping types to facilitate understanding, the examples provided herein may be implemented with different doping types and materials. For example, the p+ regions (e.g., non-insulative region 108) may be replaced with a Schottky contact and/or the n+ regions (e.g., non-insulative region 106) may be replaced with a metal ohmic contact. In the case where a Schottky contact is used in combination with a III-V process technology, an extra wide bandgap layer may be interposed between the metal and the n-doped semiconductor in order to reduce the current leakage associated with the Schottky contact.

Certain aspects described herein may be implemented using different technologies such as bulk complementary metal-oxide semiconductor (CMOS), bipolar CMOS and double-diffused metal-oxide semiconductor (DMOS) referred to as bipolar-CMOS-DMOS (BCD), bipolar CMOS (BiCMOS), bipolar, silicon on insulator (SOI) (including ultra-thin-body, fully depleted, partially depleted, high voltage and any other SOI technology), silicon on sapphire, thin-film, trench MOS, junction field-effect transistor (JFET), fin field-effect transistor (FinFET), multi-gate FET (including tri-gate FET and gate-all-around technology), vertical MOS, silicon carbide (SiC), germanium (Ge), silicon germanium (SiGe) (any other IV-IV compound semiconductor material), III-V technology (e.g. gallium nitride (GaN), aluminum gallium nitride (AlGaN), aluminum nitride (AlN), indium nitride (InN), indium gallium nitride (InGaN), gallium arsenide (GaAs), aluminum gallium arsenide (AlGaAs), aluminum arsenide (AlAs), and any other polar and non-polar III-V compound semiconductor material including ternary and quaternary alloys) with or without heterojunctions, II-VI technology (polar and non-polar II-VI compound semiconductor material including ternary and quaternary alloys) with or without heterojunctions, or discrete device technologies (e.g. the ones used for discrete silicon or SiC MOS discrete power devices or for III-V discrete devices), including both organic and inorganic technologies. Different doping profiles can be used in order to improve the device performance. If desired, high-k dielectric materials can be used to form the capacitance dielectric so as to increase the capacitance density. The plate region can be formed with metallic or semiconductor (crystalline, poly-crystalline or amorphous) materials.

Certain aspects described herein may be realized as integrated or discrete components. A dual version of the transcap devices described herein may be obtained by substituting the n-doped regions with p-type ones and vice-versa. In certain aspects, the n+ control regions may be replaced with Schottky contacts and/or the p+ well pick-up regions may be replaced with metal ohmic contacts. Many other configurations may be obtained by combining different aspects discussed herein and their variants.

Certain aspects of the present disclosure may be realized with a standard SOI or bulk CMOS process. The distance between the doping implants and the capacitance electrode P may be omitted by auto-aligning the implantations with the MOS structure or may be obtained by adding two spacers to the structure during the fabrication process or by mis-aligning the n+ (or p+) implantation mask with respect to the MOS oxide edge. The latter allows the achievement of any desired distance between the highly doped regions and the oxide edge. In certain aspects, one or more extra process steps may also be used in order to form pillars/trenches in the semiconductor substrate (by means of a semiconductor etching or a deposition process steps) and/or to obtain the buried doped regions at the beginning of the manufacturing process.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c"

is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal, supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor capacitor comprising:
   an insulative layer;
   a semiconductor region disposed adjacent to a first side of the insulative layer; and
   a first non-insulative region disposed adjacent to a second side of the insulative layer, wherein:
   the semiconductor region comprises a second non-insulative region and at least two regions having at least one of different doping concentrations or different doping types;
   one or more junctions between the at least two regions are disposed above or below the first non-insulative region;
   the semiconductor region comprises a third non-insulative region such that a capacitance between the first non-insulative region and the second non-insulative region is configured to be adjusted by varying a control voltage applied to the third non-insulative region with respect to the first non-insulative region or the second non-insulative region;
   the at least two regions comprises:
      a first region adjacent to the second non-insulative region and having a same doping type, but a lower doping concentration, than the second non-insulative region,
      a second region adjacent to the third non-insulative region and having a same doping type, but a lower doping concentration, than the third non-insulative region, and
      an intrinsic region;
   the first region, the second region, and the intrinsic region are between the second non-insulative region and the third non-insulative region; and
   the intrinsic region is between the first region and the second region.

2. The semiconductor capacitor of claim 1, wherein the first region comprises an n-well region and the second region comprises a p-well region.

3. The semiconductor capacitor of claim 1, wherein:
   the first region and the second region comprise n-well regions; or
   the first region and the second region comprise p-well regions.

4. The semiconductor capacitor of claim 1, further comprising a buried oxide (BOX) region, wherein the insulative layer comprises a portion of the BOX region disposed between the semiconductor region and the first non-insulative region.

5. The semiconductor capacitor of claim 4, further comprising a silicide-blocking layer, wherein the BOX region and the silicide-blocking layer are disposed adjacent to opposite sides of the semiconductor region.

6. A semiconductor capacitor comprising:
   an insulative layer;
   a semiconductor region disposed adjacent to a first side of the insulative layer and comprising an intrinsic region;
   a first non-insulative region disposed adjacent to a second side of the insulative layer, wherein the semiconductor region further comprises a second non-insulative region having a first doping type; and a buried oxide (BOX) region, wherein the insulative layer comprises a portion of the BOX region disposed between the semiconductor region and the first non-insulative region.

7. The semiconductor capacitor of claim 6, wherein:
the semiconductor region further comprises a third non-insulative region having a second doping type; and
the intrinsic region is disposed between the second non-insulative region and the third non-insulative region.

8. The semiconductor capacitor of claim 6, wherein:
the semiconductor region further comprises at least one region having a different doping concentration or doping type than the intrinsic region; and
one or more junctions between the at least one region and the intrinsic region are disposed above or below the first non-insulative region.

9. The semiconductor capacitor of claim 8, wherein the at least one region comprises at least two regions including an n-well region and a p-well region.

10. The semiconductor capacitor of claim 9, wherein the intrinsic region is disposed between the n-well region and the p-well region.

11. The semiconductor capacitor of claim 9, wherein the n-well region is disposed between the p-well region and the intrinsic region.

12. The semiconductor capacitor of claim 6, further comprising a silicide-blocking layer, wherein the BOX region and the silicide-blocking layer are disposed adjacent to opposite sides of the semiconductor region.

\* \* \* \* \*